US010170442B2

(12) United States Patent
Hine et al.

(10) Patent No.: US 10,170,442 B2
(45) Date of Patent: Jan. 1, 2019

(54) MOUNT STRUCTURE INCLUDING TWO MEMBERS THAT ARE BONDED TO EACH OTHER WITH A BONDING MATERIAL LAYER HAVING A FIRST INTERFACE LAYER AND A SECOND INTERFACE LAYER

(71) Applicant: Panasonic Intellectual Property Management Co., Ltd., Osaka (JP)

(72) Inventors: Kiyohiro Hine, Osaka (JP); Akio Furusawa, Osaka (JP); Hidetoshi Kitaura, Osaka (JP); Kazuki Sakai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/797,296

(22) Filed: Oct. 30, 2017

(65) Prior Publication Data
US 2018/0166411 A1    Jun. 14, 2018

(30) Foreign Application Priority Data
Dec. 8, 2016    (JP) .................................. 2016-238751

(51) Int. Cl.
*H01L 23/00*    (2006.01)
*B23K 35/26*    (2006.01)
(Continued)

(52) U.S. Cl.
CPC .............. *H01L 24/29* (2013.01); *B23K 35/26* (2013.01); *B23K 35/262* (2013.01); *C22C 13/00* (2013.01);
(Continued)

(58) Field of Classification Search
CPC ....... H01L 2924/0133; H01L 2924/014; H01L 24/29
See application file for complete search history.

(56) References Cited

U.S. PATENT DOCUMENTS

| 8,633,103 B2 * | 1/2014 | Hata ....................... H01L 24/11 438/614 |
| 8,999,519 B2 | 4/2015 | Nishimura |

(Continued)

FOREIGN PATENT DOCUMENTS

| WO | 2009/051255 | 4/2009 |
| WO | 2014/103934 | 7/2014 |

(Continued)

*Primary Examiner* — Quoc Hoang
(74) *Attorney, Agent, or Firm* — Wenderoth, Lind & Ponack, L.L.P.

(57) ABSTRACT

A mount structure includes two members that are bonded to each other with a bonding material layer having a first interface layer and a second interface layer at the interfaces with the two members. The bonding material layer contains a first intermetallic compound and a stress relaxation material. The first intermetallic compound has a spherical, a columnar, or an oval spherical shape, and the same crystalline structure as the first interface layer and the second interface layer, and partly closes the space between the first interface layer and the second interface layer. The stress relaxation material contains tin as a main component, and fills around the first intermetallic compound.

6 Claims, 1 Drawing Sheet

(51) Int. Cl.
    *C22C 13/00* (2006.01)
    *H01L 23/488* (2006.01)
    *H01L 21/52* (2006.01)

(52) U.S. Cl.
    CPC .............. *H01L 21/52* (2013.01); *H01L 23/00* (2013.01); *H01L 23/488* (2013.01); *H01L 2224/29083* (2013.01); *H01L 2224/29209* (2013.01); *H01L 2224/29211* (2013.01); *H01L 2224/29213* (2013.01); *H01L 2224/29217* (2013.01); *H01L 2224/29239* (2013.01); *H01L 2224/29247* (2013.01); *H01L 2224/29255* (2013.01); *H01L 2224/29257* (2013.01); *H01L 2924/014* (2013.01); *H01L 2924/3512* (2013.01)

(56) References Cited

U.S. PATENT DOCUMENTS

| | | | |
|---|---|---|---|
| 9,105,987 B2 * | 8/2015 | Nakano | B23K 35/0244 |
| 9,320,152 B2 | 4/2016 | Terashima et al. | |
| 2015/0319877 A1 | 11/2015 | Ohashi et al. | |

FOREIGN PATENT DOCUMENTS

| | | |
|---|---|---|
| WO | 2014/192521 | 12/2014 |
| WO | 2015/079844 | 6/2015 |

* cited by examiner

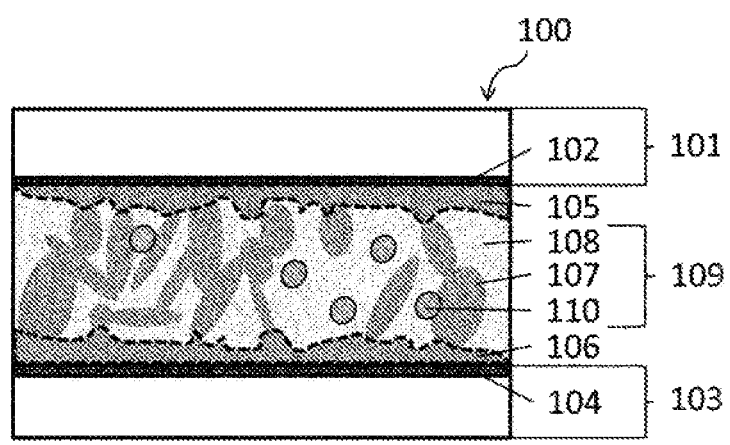

MOUNT STRUCTURE INCLUDING TWO MEMBERS THAT ARE BONDED TO EACH OTHER WITH A BONDING MATERIAL LAYER HAVING A FIRST INTERFACE LAYER AND A SECOND INTERFACE LAYER

TECHNICAL FIELD

The technical field relates to a mount structure including two members that are bonded to each other with a metallic material, for use in applications such as in power devices.

BACKGROUND

For dissipation of generated heat, heat generating devices such as power devices and LEDs use a mount structure in which a device-mounted substrate and a heat-dissipating unit are bonded to each other to transport heat from the substrate to the heat-dissipating unit.

In recent years, heat-generating devices, including power devices, generate increasing amounts of heat as the output of these devices continues to increase. This has created a demand for a more efficient means of heat dissipation from these devices. For more efficient heat dissipation, efforts are made to increase the area of the joint connecting the mount structure members. The measure to increase the bonding area is taken to provide a larger heat-releasing channel for more efficient dissipation of heat.

SUMMARY

However, because the temperature of the joint increases with the generated heat from the operating mount structure, a joint connecting two members of different materials experiences thermal stress and thermal strain of magnitudes that depend on the difference in the linear coefficients of expansion of the two members. A solder material enables bonding at low temperature, and has been widely used as a bonding material for a mount structure joint. However, the thermal strain and the thermal stress increase as the bonding area becomes larger, which results in a crack occurring in the solder joint when repeated temperature changes occur in the joint. Such a crack in the joint leads to poor heat dissipation and low bonding strength. Accordingly, there is a need for a mount structure that can withstand the crack propagation due to repeated temperature changes, even when the joint has a large area exceeding 10 mm$^2$.

The mount structure described in WO2015/079844 is a known example of a traditional mount structure that can resist crack propagation. The mount structure described in this related art is bonded with an intermetallic compound that is generated when a first metal (for example, Sn, or an Sn-containing alloy) and a second metal having a higher melting point than the first metal (for example, a Cu-based alloy such as a Cu—Ti alloy, and a Cu—Mo alloy) are heated to a temperature equal to or greater than the melting point of the first metal. The generated intermetallic compound has a higher melting point than the first metal.

In the mount structure of WO2015/079844 produced by generating an intermetallic compound, the high-melting-point intermetallic compound occurs without leaving the low-melting-point tin, and makes a joint having high strength and desirable heat resistance. However, the generated intermetallic compound is very brittle. Further, the generation of the intermetallic compound involves contraction due to the volume difference between the intermetallic compound and tin, and voids tend to remain in the joint as the bonding area increases. A large thermal stress due to the large bonding area often results in crack propagation.

The present disclosure is intended to provide a solution to the foregoing problems, and it is an object of the disclosure to provide a mount structure that can withstand a large thermal stress due to a large bonding area, and in which the generation and propagation of a crack due to repeated temperature changes are reduced.

A mount structure of an aspect of the present disclosure includes two members that are bonded to each other with a bonding material layer having a first interface layer and a second interface layer at the interfaces with the two members, the bonding material layer containing a first intermetallic compound and a stress relaxation material, the first intermetallic compound having a spherical, a columnar, or an oval spherical shape, and the same crystalline structure as the first interface layer and the second interface layer, and partly closing the space between the first interface layer and the second interface layer, the stress relaxation material containing tin as a main component, and filling around the first intermetallic compound.

As used herein, "main component" means an element having the highest proportion among the elements contained in the stress relaxation material.

The present disclosure enables providing a mount structure that can withstand a large thermal stress created by a large bonding area, and in which the generation and propagation of a crack due to repeated temperature changes are reduced.

BRIEF DESCRIPTION OF THE DRAWINGS

FIGURE is a diagram showing a cross section taken along the lamination direction of a first and a second member of a mount structure of an embodiment of the present disclosure.

DESCRIPTION OF EMBODIMENTS

An embodiment of the present disclosure is described below with reference to the accompanying drawing.

FIGURE shows a mount structure 100 in which two members—a first member 101 and a second member 103—are bonded together with a bonding material layer 109 having a first interface layer 105 and a second interface layer 106 at the interfaces with these two members.

First Member 101, and Second Member 103

The first member 101 has a first bonded material 102 on the surface opposite the second member 103. The first member 101 may use any material, as long as the bonded material can be provided on the surface opposite the second member 103. Non-limiting examples of such materials include Si, SiC, GaN, GaAs, and ceramics. The second member 103 has a second bonded material 104 on the surface opposite the first member 101. Accordingly, the first bonded material 102 and the second bonded material 104 are disposed face to face. The second member 103 may use any material, as long as the bonded material can be provided on the surface opposite the first member 101. Non-limiting examples of such materials include a Cu plate, and an Al plate.

The first bonded material 102 and the second bonded material 104 may be materials that can form a compound with the elements contained in the bonding material layer 109 under the heat and pressure of bonding so that the compound formed on the surfaces of the bonding material layer 109 can form interface layers. The material may be selected from various materials according to the elements contained in the bonding material layer 109, and, for example, Ni or Cu may be used. The surfaces of the first bonded material 102 and the second bonded material 104 are covered with the first interface layer 105 and the second interface layer 106, respectively, that are formed upon bonding.

First Interface Layer 105, and Second Interface Layer 106

The first interface layer 105 and the second interface layer 106 are layers of a compound formed at the interfaces between the bonding material layer 109 and the two members 101 and 103 under the heat and pressure of bonding. The compound is formed by the first bonded material 102, the second bonded material 104, and the elements contained in the bonding material layer 109. The first interface layer 105 and the second interface layer 106 have the same crystalline structure, and are bonded to each other via the bonding material layer 109. The compound forming the first interface layer 105 and the second interface layer 106 depends on the material used for the bonded material, and the elements contained in the bonding material layer, and may be, for example, $(Cu,Ni)_6Sn_5$.

Bonding Material Layer 109

The bonding material layer 109 has a structure containing a first intermetallic compound 107 and a stress relaxation material 108. The bonding material layer 109 may additionally contain a second intermetallic compound 110 having a different crystalline structure from the first interface layer 105 and the second interface layer 106, and dispersed in the bonding material layer 109.

The first intermetallic compound 107 is a spherical, a columnar, or an oval spherical compound having the same crystalline structure as the first interface layer 105 and the second interface layer 106.

Because the first intermetallic compound 107 has the same crystalline structure as the first interface layer 105 and the second interface layer 106, the first intermetallic compound 107 can join the first interface layer 105 and the second interface layer 106 as shown in FIGURE. In this specification, the state of the first interface layer 105 and the second interface layer 106 being joined to each other by the first intermetallic compound 107 describes the state where the space between the first interface layer 105 and the second interface layer 106 is "closed". With the compound of the same crystalline structure as the first interface layer 105 and the second interface layer 106 closing a part of the space between the first interface layer 105 and the second interface layer 106, it is possible to spread the stress that easily concentrates near the interfaces between the bonding material layer 109 and the interface layers 105 and 106, and thereby reduce crack propagation.

As used herein, "crystalline structure" refers to the shape of an alloy particle that is common to the first intermetallic compound 107, the first interface layer 105, and the second interface layer 106 because it uses the same compound as these members. As used herein, the term "spherical" used to describe the shape of the crystalline structure is not limited to a true sphere, and includes shapes that are substantially spherical with the minimum diameter of the crystalline structure being 90% or more of the maximum diameter. As used herein, the term "columnar" used to describe the shape of the crystalline structure refers to a crystalline structure having a long axis and a short axis, and in which the dimensional ratio of the short axis to the long axis is ½ or less. As used herein, the terra "oval spherical" used to describe the shape of the crystalline structure refers to an oval sphere in which the minimum diameter of the crystalline structure is 50% or more and 90% or less of the maximum diameter.

The spherical, columnar, or oval spherical shape of the first intermetallic compound 107 makes the first intermetallic compound 107 strong. Accordingly, the closed portion does not easily undergo deformation under thermal stress, and the thermal stress occurring in the bonding material layer 109 can be prevented from concentrating on the stress relaxation material 108. This makes it possible to reduce crack propagation in the bonding material layer 109.

The material used for the first intermetallic compound 107 may be selected according to the compound forming the bonding material layer 109, and may be, for example, $(Cu,Ni)_6Sn_5$. Such compounds have high elastic modulus, and the closed portion formed by such high-elastic-modulus compounds does not easily undergo deformation. The stress is thus unlikely to add to a crack, even when a crack has occurred in the bonding material layer 109. This makes it possible to more effectively reduce crack propagation.

The stress relaxation material 108 contains tin as a main component, and fills around the first intermetallic compound 107, as illustrated in FIGURE. With the stress relaxation material 108 filling around the first intermetallic compound so as to fill the voids between the first intermetallic compounds 107 as shown in FIGURE, the bonding material layer 109 can form without voids, which are a potential source of cracking. This makes it possible to reduce cracking in the bonding material layer 109.

Because the stress relaxation material 108 contains tin as a main component, the stress relaxation material 108 has a smaller elastic modulus, and more desirable ductility than the first intermetallic compound 107 of a spherical, a columnar, or an oval spherical shape adding strength to the first intermetallic compound 107. This makes it possible to effectively reduce crack propagation in the stress relaxation material 108.

The stress relaxation material 108 may contain Co or Ge, in addition to Sn. With the stress relaxation material 108 containing Sn, and Co or Ge, crack propagation can be effectively reduced.

Cobalt and germanium also act to reduce leaching of the bonded material during the formation of the interface layers.

The stress relaxation material 108 may contain In or Bi, in addition to Sn. With the stress relaxation material 108 containing Sn, and In or Bi, crack propagation can be more effectively reduced.

Indium also acts to improve the strength and the relaxation characteristics of the stress relaxation material. Bismuth also acts to improve the strength of the stress relaxation material.

The bonding material layer 109 may contain the second intermetallic compound 110 having a different crystalline structure from the first interface layer 105 and the second interface layer 106. The second intermetallic compound 110 may be any compound, as long as it has a different crystalline structure from the first interface layer 105 and the second interface layer 106. Non-limiting examples of such compounds include $Ag_3Sn$, and $Ag_2In$.

EXAMPLES

In order to confirm the effects of the present disclosure, a test was conducted for mount structures that were fabricated to include large-area joints of 10 $mm^2$ and 15 $mm^2$ according to the foregoing embodiment. Here, a 15-$mm^2$ Si chip with an Ni plating formed as the first bonded material 102 on the back surface was used as the first member 101. For the second member 103, a Cu plate was used that had an Ni plating formed as the second bonded material 104 on the back surface. The mount structure was fabricated in the manner described below.

First, a flux was applied to the Cu plate (the second member 103), and a foil of a solder material that forms the bonding material layer 109 was fed onto the flux. Thereafter, a flux was applied to the solder material foil, and the Si chip (the first member 101) was mounted on the flux. The whole structure was heated to 280° C. to melt the solder material. While the solder material was in a molten state, a force was applied by pressing down the Si chip to adjust the layer thickness between the bonded Cu plate and Si chip to 100 μm. Thereafter, the structure was cooled to 100° C. at a cooling rate of 5° C./sec, and then to room temperature by natural cooling to finish bonding. The solder materials used are shown in Table 1 (Examples 1 to 7, and Comparative Examples 1 to 3). In Table 1, "bal." means balance.

The mount structure fabricated in the manner described above was examined to confirm the initial void state by scanning acoustic tomography (SAT). The results of observation are presented in Table 1, in which the open circle represents a percentage void of 20% or less, and the cross represents higher percentages than that. The mount structure was also examined to identify the compositions of the first interface layer 105, the second interface layer 106, the first intermetallic compound 107, and, when contained, the second intermetallic compound 110 by observing a cross section by scanning electron micoroscopy (SEM) and energy dispersive X-ray spectrometry (EDX). The closed state of the first intermetallic compound 107 between the interface layers 105 and 106 was also confirmed. The results are presented in Table 1. The closure between the interface layers 105 and 106 was examined by cross sectional observations, and was determined as Good when the space between the first interface layer 105 and the second interface layer 106 was closed at least partly with the first intermetallic compound 107. Poor when there was no closure, and Acceptable when the space was closed with the second intermetallic compound 110.

After confirming the initial state, a temperature cycle test was conducted in a repeating temperature cycle with a lower temperature of −40° C., and a higher temperature of 125° C. The temperature cycle test was conducted in 500 cycles according to the liquid vessel scheme, in which the mount structure was held at the upper-limit and the lower-limit temperature for 5 minutes at each temperature. After the test, the mount structure was checked again for any crack by SAT observation. The observation results are presented in Table 1. In order to determine if the bond is still made even after the crack propagation, arbitrarily taken cross sections of the 10-mm$^2$ and 15-mm$^2$ joints 109 were observed, and the mount structure was determined as Excellent when the proportion of the crack area (the area percentage of a crack) in the cross sectional area was ⅓ or less, Good when the area percentage of a crack was higher than ⅓ and ½ or less in either of the 10-mm$^2$ and 15-mm$^2$ joints 109, and Poor when the area percentage of a crack was higher than ½ of the whole cross sectional area in either of the 10-mm$^2$ and 15-mm$^2$ joints 109.

TABLE 1

| | Solder composition (wt %) | | | | | | Interface layers | | Intermetallic compounds | | Closure | Void | Crack Evaluation |
|---|---|---|---|---|---|---|---|---|---|---|---|---|---|
| | Sn | Cu | Ni | Ag | In | Bi | Other | First | Second | First | Second | | | |
| Ex. 1 | bal. | 10 | 2.0 | | | | | (Cu,Ni)$_6$Sn$_5$ | (Cu,Ni)$_6$Sn$_5$ | (Cu,Ni)$_6$Sn$_5$ | None | Good | ○ | Good |
| Ex. 2 | bal. | 18 | 2.0 | | | | | (Cu,Ni)$_6$Sn$_5$ | (Cu,Ni)$_6$Sn$_5$ | (Cu,Ni)$_6$Sn$_5$ | None | Good | ○ | Good |
| Ex. 3 | bal. | 18 | 2.0 | 3.0 | | | | (Cu,Ni)$_6$Sn$_5$ | (Cu,Ni)$_6$Sn$_5$ | (Cu,Ni)$_6$Sn$_5$ | Ag$_3$Sn | Good | ○ | Good |
| Ex. 4 | bal. | 18 | 2.0 | | 6.0 | | | (Cu,Ni)$_6$Sn$_5$ | (Cu,Ni)$_6$Sn$_5$ | (Cu,Ni)$_6$Sn$_5$ | None | Good | ○ | Excellent |
| Ex. 5 | bal. | 18 | 2.0 | | | 3.0 | | (Cu,Ni)$_6$Sn$_5$ | (Cu,Ni)$_6$Sn$_5$ | (Cu,Ni)$_6$Sn$_5$ | None | Good | ○ | Excellent |
| Ex. 6 | bal. | 18 | 2.0 | | | | Co 0.1 | (Cu,Ni)$_6$Sn$_5$ | (Cu,Ni)$_6$Sn$_5$ | (Cu,Ni)$_6$Sn$_5$ | None | Good | ○ | Good |
| Ex. 7 | bal. | 18 | 2.0 | | | | Ge 0.1 | (Cu,Ni)$_6$Sn$_5$ | (Cu,Ni)$_6$Sn$_5$ | (Cu,Ni)$_6$Sn$_5$ | None | Good | ○ | Good |
| Com. Ex. 1 | bal. | 0.7 | 2.0 | | | | | (Cu,Ni)$_6$Sn$_5$ | (Cu,Ni)$_6$Sn$_5$ | (Cu,Ni)$_6$Sn$_5$ | None | Poor | ○ | Poor |
| Com. Ex. 2 | bal. | 0.7 | 2.0 | 3.0 | | | | (Cu,Ni)$_6$Sn$_5$ | (Cu,Ni)$_6$Sn$_5$ | (Cu,Ni)$_6$Sn$_5$ | Ag$_3$Sn | Poor | ○ | Poor |
| Com. Ex. 3 | bal. | 0.7 | 2.0 | 3.0 | | | | (Cu,Ni)$_6$Sn$_5$ | (Cu,Ni)$_6$Sn$_5$ | (Cu,Ni)$_6$Sn$_5$ | Ag$_3$Sn | Acceptable | ○ | Poor |

Large initial voids were not observed in any of Examples 1 to 7, and Comparative Examples 1 to 3. This is the result of the first intermetallic compound 107 in the bonding material layer 109 being generated not by the reaction between the solid Cu in the bonded materials 102 and 104 and the Sn in the solder material, but by the reaction occurring during the melting and solidification of the solder material between the Cu and Sn contained in the solder material.

In Examples 1 to 7 and Comparative Examples 1 to 3, the solder material contained Cu and Ni, and (Cu,Ni)$_6$Sn$_5$ was contained in all of the first interface layer 105, the second interface layer 106, and the first intermetallic compound 107. In Examples 1 to 7, (Cu,Ni)$_6$Sn$_5$ was abundant in the first intermetallic compound 107 because of the relatively large Cu content, and closure occurred at least partly.

The silver contained in the solder materials of Example 3 and Comparative Example 2 existed as $Ag_3Sn$ in the second intermetallic compound 110, and was dispersed in the bonding material layer 109.

In Comparative Examples 1 and 2, the first intermetallic compound 107 contained $(Cu,Ni)_6Sn_5$ only in small amounts because of the small Cu content, and there was no closure. In Comparative Example 3, $Ag_3Sn$ was present in large amounts as the second intermetallic compound 110 because of the large Ag content, and formed a closed structure.

The elements, excluding Cu and Ni, contained in the solder materials of Examples 4 to 7 did not exist as the first intermetallic compound 107. Indium and bismuth dissolved in the stress relaxation material 108 as a solid solution, whereas cobalt and germanium were not observed because these elements were contained in trace amounts. However, these elements are probably contained in the first interface layer 105, the second interface layer 106, or the stress relaxation material 108.

In Examples 1 to 7, no large cracks were observed, and the results of determination were either Excellent or Good. However, large cracks were observed in Comparative Examples 1 to 3. In Comparative Examples 1 and 2, cracks propagated in the Sn layer, or the stress relaxation material 108. This is probably the result of the mount structure failing to withstand the thermal stress because of the lack of a closed structure of the first intermetallic compound 107, and the concentrated load in the stress relaxation material 108. In Comparative Example 3, cracks propagated between the second interface layer 106 and the first intermetallic compound 107, and between the second interface layer 106 and the stress relaxation material 108. This is probably the result of the second interface layer 106 and the first intermetallic compound 107 having different crystalline structures, and causing the load to concentrate at the interfaces of different properties.

It was found from the results of the foregoing Examples that the mount structure of the embodiment of the present disclosure can exhibit its effect under the following preferred conditions. The mount structure includes two members that are bonded to each other with a bonding material layer having a first interface layer and a second interface layer at the interfaces with the two members. The bonding material layer is configured as a layer that contains a first intermetallic compound and a stress relaxation material, and, optionally, a second intermetallic compound. The first intermetallic compound has the same crystalline structure as the first interface layer and the second interface layer, and partly closes the space between the first interface layer and the second interface layer. The stress relaxation material contains tin as a main component, and fills around the first intermetallic compound.

The mount structure of the embodiment of the present disclosure also can exhibit its effect under the following preferred conditions. The first intermetallic compound has a spherical, a columnar, or an oval spherical shape. The second intermetallic compound has a different crystalline structure from the first interface layer 105 and the second interface layer 106, and is dispersed in the bonding material layer 109.

INDUSTRIAL APPLICABILITY

The present disclosure can provide a mount structure having a large bonding area that provides excellent heat dissipation characteristics in power devices, LEDs, and other such devices that involve large heat dissipation. The disclosure can thus contribute to improvement of device performance.

What is claimed is:

1. A mount structure comprising two members that are bonded to each other with a bonding material layer having a first interface layer and a second interface layer at the interfaces with the two members,
    the bonding material layer containing a first intermetallic compound and a stress relaxation material,
        the first intermetallic compound having a spherical, a columnar, or an oval spherical shape, and same crystalline structure as the first interface layer and the second interface layer, and partly closing space between the first interface layer and the second interface layer,
        the stress relaxation material containing tin as a main component, and filling around the first intermetallic compound,
    wherein the first interface layer, the second interface layer, and the first intermetallic compound are $(Cu,Ni)_6Sn_5$.

2. The mount structure according to claim 1, wherein the bonding material layer further comprises a second intermetallic compound having a different crystalline structure from the first interface layer and the second interface layer.

3. The mount structure according to claim 1, wherein the stress relaxation material contains Sn, and In or Bi.

4. The mount structure accordingly to claim 1, wherein the stress relaxation material contains Sn, and Co or Ge.

5. A mount structure comprising two members that are bonded to each other with a bonding material layer having a first interface layer and a second interface layer at the interfaces with the two members,
    the bonding material layer containing a first intermetallic compound and a stress relaxation material,
        the first intermetallic compound having a spherical, a columnar, or an oval spherical shape, and same crystalline structure as the first interface layer and the second interface layer, and partly closing space between the first interface layer and the second interface layer,
        the stress relaxation material containing tin as a main component, and filling around the first intermetallic compound,
    wherein the stress relaxation material contains Sn, and Co or Ge.

6. A mount structure comprising two members that are bonded to each other with a bonding material layer having a first interface layer and a second interface layer at the interfaces with the two members,
    the bonding material layer containing a first intermetallic compound and a stress relaxation material,
        the first intermetallic compound having a spherical, a columnar, or an oval spherical shape, and same crystalline structure as the first interface layer and the second interface layer, and partly closing space between the first interface layer and the second interface layer,
        the stress relaxation material containing tin as a main component, and filling around the first intermetallic compound,
    wherein the bonding material layer further comprises a second intermetallic compound having a different crystalline structure from the first interface layer and the second interface layer, and
    wherein the second intermetallic compound is $Ag_3Sn$.

* * * * *